(12) United States Patent
Kan (10) Patent No.: US 11,755,803 B2
(45) Date of Patent: Sep. 12, 2023

(54) PROGRAMMABLE MACRO TEST DESIGN FOR AN INTEGRATED CIRCUIT

(71) Applicant: Cypress Semiconductor Corporation, San Jose, CA (US)

(72) Inventor: Senwen Kan, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/513,584

(22) Filed: Oct. 28, 2021

(65) Prior Publication Data
US 2023/0135977 A1     May 4, 2023

(51) Int. Cl.
*G01R 31/317*     (2006.01)
*G06F 30/333*     (2020.01)

(52) U.S. Cl.
CPC ............... *G06F 30/333* (2020.01); *G01R 31/31724* (2013.01)

(58) Field of Classification Search
CPC ............... G06F 30/333; G01R 31/31724
See application file for complete search history.

(56) References Cited

U.S. PATENT DOCUMENTS

| | | | | |
|---|---|---|---|---|
| 7,036,064 | B1* | 4/2006 | Kebichi et al. | G11C 29/56012 714/744 |
| 2006/0212764 | A1* | 9/2006 | Slobodnik et al. | G11C 29/16 714/718 |
| 2013/0031319 | A1* | 1/2013 | Gorman et al. | G11C 29/785 711/E12.079 |

* cited by examiner

*Primary Examiner* — Nghia M Doan (57) ABSTRACT

A system and method for using a programmable macro built-in self-test (BIST) to test an integrated circuit. The method includes receiving, by a built-in self-test (BIST) controller of an integrated circuit (IC) device from a testing equipment, a test vector of a first type for testing a first region of the IC device. The method includes identifying, based on the test vector of the first type, a first BIST engine of a plurality of BIST engines associated with the first region of the IC device. The method includes generating, based on the test vector of the first type, a first command of the second type. The method includes configuring, based on the first command of the second type, the first BIST engine of the plurality of BIST engines to cause the first BIST engine to perform a first set of tests on the first region of the IC device.

20 Claims, 8 Drawing Sheets

PROGRAMMABLE MACRO TEST DESIGN FOR AN INTEGRATED CIRCUIT

TECHNICAL FIELD

The present disclosure relates generally to the field of memory devices, and more particularly, to a programmable macro test for an integrated circuit.

BACKGROUND

Computing devices often rely on stored digital information which is mainly data that can be used to direct circuit performance. The digital information may be stored in different types of integrated circuits, such as memory devices. Random Access Memory (RAM) is where the memory can be randomly accessed at any instant, without having to step through each memory location. RAM memory is volatile, which means that the information stored in the RAM will be lost once the power to it is removed. Conversely, Read Only Memory (ROM) is non-volatile in that its contents are not lost when power to it is removed. Memory devices are often tested for detects before being sold into the market.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

The following description sets forth numerous specific details such as examples of specific systems, components, methods, and so forth, in order to provide a good understanding of various embodiments of the techniques described herein for using a programmable macro built-in self-test (BIST) to test an integrated circuit. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

Developers of integrated circuit (IC) devices, such as memory devices, may use an external automated test equipment (ATE) for high-volume testing of the semiconductor chips. The ATE may test a memory device by reading/writing data patterns to address locations of the memory device to confirm that the address locations are defect-free (e.g., no circuit defects, no semiconductor manufacturing defects, etc.). Since ATEs tend to be large and expensive, an IC device developer may prefer to test an IC device using one or more internal built-in self-test (BIST) engines, which are often faster than the ATE. In this instance, the ATE would simply provide a clock signal to the BIST engines of the IC device, which in turn, would cause the BIST engines to directly apply the data patterns to regions (e.g., memory locations of memory banks, subsystems of the IC device) and evaluate the memory and subsystem outputs. Thus, the BIST engines of the IC device would handle the stimulus and observation features while occupying only a small portion of the real estate of the IC device.

While the conventional BIST engines provide advantages over the ATE, they too have significant limitations that negatively impact an IC device developer's capability to efficiently and cost-effectively test IC devices. In particular, the conventional BIST engines use algorithms that are often hardcoded in the BIST engine, which makes it impossible for the IC device developer to program and execute the conventional BIST engines in any arbitrary combination while maintaining complete test program reusability. While conventional BIST engine may be implemented with programmability, such programmability is only limited at the BIST engine level but does not exist at the full chip level. However, such programmability comes at a cost of silicon area as programmable registers must be implemented at BIST engine level for each BIST engine. Additionally, conventional BIST implementation does not provide a method to broadcast soft memory test algorithm to all or a subset of BIST engines on chip. Furthermore, memory test requiring system level operations such as power switching are beyond the scope of even conventional BIST engines with programmability.

Aspects of the disclosure address the above-noted and other deficiencies by incorporating a programmable macro built-in self-test (BIST) controller to control a set of BIST engines to test an integrated circuit. As described in the below passages, in some embodiments, a built-in self-test (BIST) controller of an integrated circuit (IC) device may be configured to receive a test vector of a first type from a testing equipment, where the test vector is for testing a first region of the IC device. In some embodiments, the programmable macro BIST controller may be configured to identify, based on the test vector of the first type, a first BIST engine of a plurality of BIST engines of the IC device that is associated with the first region of the IC device. In some embodiments, the programmable macro BIST controller may be configured to generate, based on the test vector of the first type, a first command of the second type. In some embodiments, the programmable macro BIST controller may be configured to program (e.g. configure), based on the first command of the second type, the first BIST engine of the plurality of BIST engines to cause the first BIST engine to perform a first set of tests on the first region of the IC device.

The program send by the ATE into the programmable macro BIST consists of macro instructions. These macro instructions are implemented in the following forms: hard coded sequences of memory test operations on MBIST engines; control switching of SRAM power and retention switches; the insertion of various time delays into a self test session; the insertion of conditional branching or redirection into the self-test program. The test program can be composed of macro instructions - each instruction is a hard coded sequence of memory test operations - eliminates the need to implement individually programmable MBIST engines -thus leading to die size savings for IC device developers. The test operations implemented on each programmable macro BIST controlled MBIST engine for each macro instruction includes MBIST testing, memory repair analysis, soft repair distribution, built-in repair analysis register (BIRA) population, and etc. Therefore, the programmable macro BIST controller allows an IC device developer to consolidate previously disparate test vectors into a single test vector (e.g., Memory Repair Analysis, Soft Repair Distribution, BIRA register population, Cumulative Repair, Memory BIST testing, Logic BIST testing), which leads to faster test time, reduced post silicon test engineering effort, and potentially faster silicon bring-up. The manufacturing flow can re-use the same Macro BIST test programs (e.g., test vectors) when the interfaces do not change from parts to parts -hence, reducing the cost of BIST test vector development.

If manufacturing coverage enhancement is needed, the IC device developer can use the programmable macro BIST controller to augment enhancement across chip/parts with ease. During post manufacturing, the programmable macro BIST controller provides a method to generate programmable power-on self-test (POST) as well as memory/logic initialization operations. That is, effective POST programs can be developed to incorporate capabilities such as retention test with programmable delays. The programmable macro BIST controller may also be used as a diagnostic tool, which can help an IC device developer to more easily identify problems in IC devices that are returned from customers.

Figure 1:
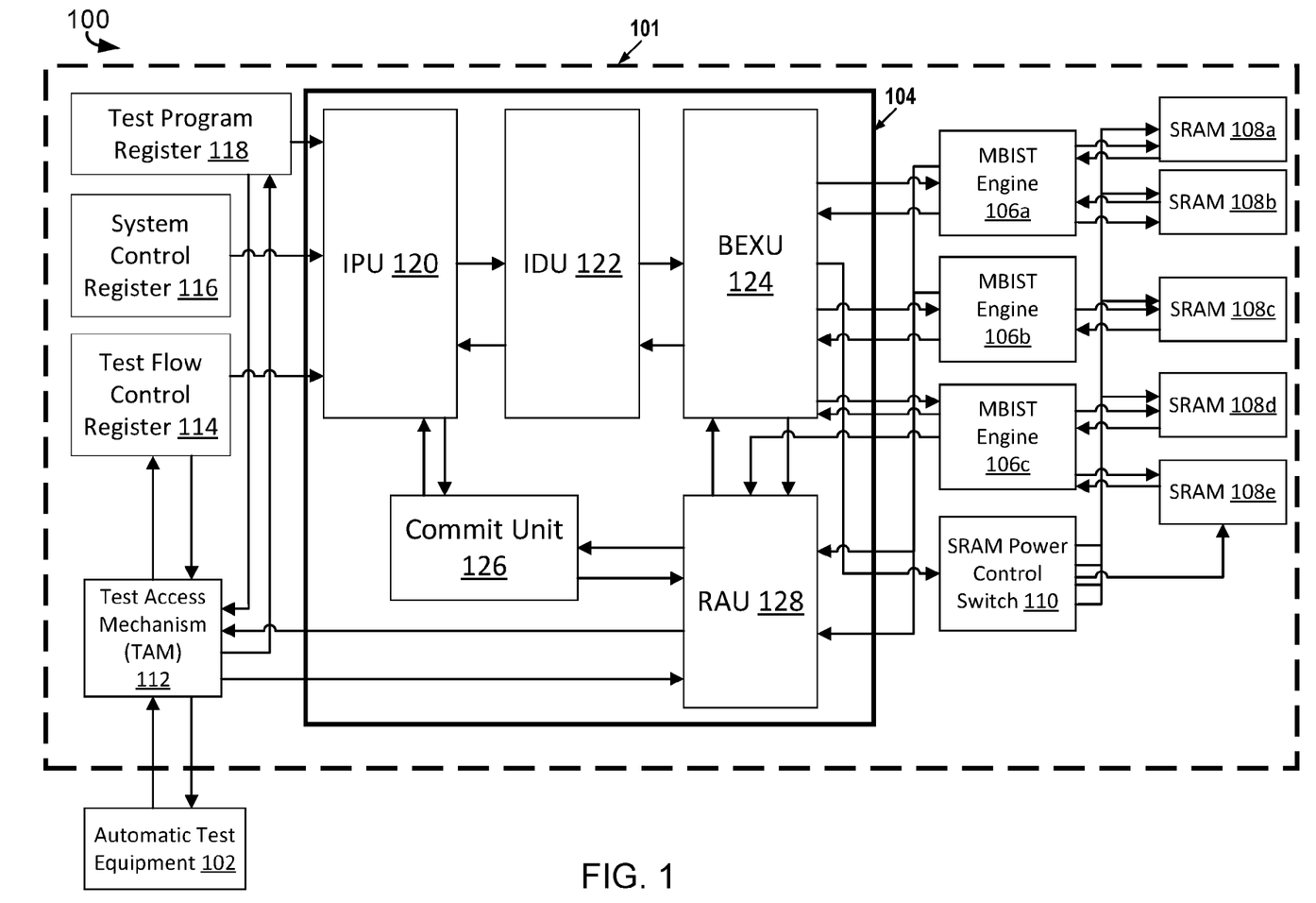
FIG. 1 is a block diagram illustrating an example environment for using a programmable macro built-in self-test (BIST) to test an integrated circuit, according to some embodiments.

FIG. 1 is a block diagram illustrating an example environment for using a programmable macro built-in self-test (BIST) to test an integrated circuit, according to some embodiments. The environment 100 includes an automatic test equipment 102 (ATE) that may be configured to perform tests on a device under test (DUT). The environment 100 includes an integrated circuit (IC) device 101, which is a DUT. Although FIG. 1 shows only one IC device 101, the ATE 102 may be configured to test many (e.g., 100's, 1000's, etc.) IC devices 101 in series or in parallel.

The IC device 101 includes a static random-access memory (shown in FIG. 1 as, SRAM 108a), an SRAM 108b, an SRAM 108c, an SRAM 108d, and an SRAM 108e (collectively referred to as, SRAMs 108).

The IC device 101 includes an on-chip test access mechanism 112 that interfaces with the ATE 102. The IC device 101 includes a test program register 118 that may be configured to store test program data (e.g., Array ({Opcode, imm} x Num_instruction)). The IC device 101 includes a system control register 116 that may be configured to store system control data (e.g., {Program Register, Sys_en, Init_en}). The IC device 101 includes a test flow control register 114 that may be configured to store test flow control data (e.g., err_limit, fail_stop, bist_mask, Bist_en}).

The ATE 102 may be configured to send a test vector (sometimes referred to as, macro test instructions) to the test flow control register 114, the system control register 116, and/or the test program register 118 via the on-chip test access mechanism 112 to read/write data (e.g., settings, instructions, flags, variables, etc.) into the registers.

In some embodiments, the test vector may be of a first type of programming language. In some embodiments, a first type of programming language may be a high-level programming language that may be readable by humans. In some embodiments, a high-level programming language may be an assembly language.

In some embodiments, the test vector may include memory repair analysis data/instructions, soft repair Distribution data/instructions, built-in redundancy analysis (BIRA) register population data/instructions (e.g., where a BIRA operation runs a BIST test and identifies how redundant repair configuration can be applied to memories for "repair," wherein the result is called a repair solution), cumulative repair data/instructions, memory BIST testing data/instructions, and/or logic BIST testing data/instructions.

In some embodiments, the test vector may indicate one or more MBIST engines 106 to be tested. In some embodiments, the test vector may indicate one or more regions (e.g., address spaces) of each MBIST engine 106 to be tested. In some embodiments, a test vector (sometimes referred to as, macro test instructions) may be a particular set, a subset, a sequence, or a subsequence of test or repair operations executed by one or more BIST controllers and/or MBIST engines. In some embodiments, a system or sub-system level operation that can excite or detect silicon defects (e.g., power mode switching or delay insertions. In some embodiments, a test vector can be defined by an instruction and associated operands.

The IC device 101 includes a memory BIST (MBIST) engine 106a, an MBIST engine 106b, and MBIST engine 106c (collectively referred to as, MBIST engines 106).

In some embodiments, the MBIST engine 106a may be configured to perform one or more memory tests on one or more regions of SRAM 108a and/or SRAM 108b, in series or in parallel. In some embodiments, the MBIST engine 106b may be configured to perform one or more memory tests on one or more regions of SRAM 108c, in series or in parallel. In some embodiments, the MBIST engine 106c may be configured to perform one or more memory tests on one or more regions of SRAM 108d and/or SRAM 108e, in series or in parallel.

The IC device 101 includes an SRAM power control switch 110 that may be configured to perform one or more system tests (e.g., power mode switching tests, delay insertion tests, etc.) on one or more subsystems of the IC device 101.

The IC device 101 includes a programmable macro BIST controller 104. The programmable macro BIST controller 104 includes an interface processing unit (IPU) 120, an instruction decode unit (IDU) 122, a BIST execution unit (BEXU) 124, a commit unit 126, and a result analysis unit (RAU) 128.

In some embodiments, the programmable macro BIST controller 104 may be configured to retrieve (e.g., fetch, read) instructions/data from the registers (e.g., the test flow control register 114, the system control register 116, and/or the test program register 118), where the instructions/data correspond to the test vector provided by the ATE 102.

In some embodiments, the programmable macro BIST controller 104 may be configured to identify one or more MBIST engines 106 (e.g., MBIST engine 106a, or MBIST engine 106b, MBIST engine 106c) of the plurality of MBIST engines 106 based on the instructions/data (e.g., the test vector of the first type) read from the registers. In some embodiments, the programmable macro BIST controller 104 may be configured to identify the SRAM power control switch 110 based on the instructions/data read (e.g., the test vector of the first type) from the registers.

In some embodiments, the programmable macro BIST controller 104 may be configured to generate one or more commands (e.g., instructions, code) of a second type (e.g., low-level programming language) based on the test vector of the first type (e.g., high-level programming language). In some embodiments, a command of a second type may be a command in a low-level programming language that is unreadable (or difficult to read) by humans. In some embodiments, a low-level programming language may be a machine language.

In some embodiments, the programmable macro BIST controller 104 may be configured to send the one or more commands to the one or more MBIST engines 106 that were previously identified to configure (e.g., program, initialize) the one or more MBIST engines 106 to cause the one or more MBIST engines 106 to perform one or more memory tests on one or more regions of the SRAMs 108.

In some embodiments, the programmable macro BIST controller 104 may be configured to send the one or more commands to the SRAM power control switch 110 that was previously identified to cause the SRAM power control switch 110 to perform one or more system tests (e.g., power mode switching tests, delay insertion tests, etc.) on one or more subsystems of the IC device 101.

In some embodiments, the MBIST engines 106 may perform memory tests on the SRAM 108 using the same or different algorithms according to the commands sent from the programmable macro BIST controller 104. For example, the MBIST engine 106a may perform a first set of memory tests on a first region of its respective SRAM 108a using a first algorithm and the MBIST engine 106b may perform a second set of memory tests on a second region of its respective SRAM 108c using a second algorithm.

In some embodiments, the SRAM power control switch 110 may perform a first set of system tests on a first set of subsystems (e.g., regions) of the IC device 101 using a first algorithm and a second set of system tests on a second set of subsystems of the IC device 101 using a second algorithm. For example, the SRAM power control switch 110 may be configured to perform a power mode switching test on a power subsystem of the IC device 101 and a delay insertion test on a clocking subsystem of the IC device 101.

In some embodiments, the test vector may be configured to be used to test one or more regions of the IC device 101 and re-used to test one or more regions of a second IC device, where the IC device 101 is of a first kind (e.g., a video driver IC device) and the second IC device (e.g., a power management IC device) is of a second kind.

In some embodiments, configuring an MBIST engine 106 of the plurality of MBIST engines 106 may cause the MBIST engine 106 to provide failure diagnostic information to the automatic testing equipment 102 that includes at least one of a memory bank identifier, a memory address identifier, a bit position identifier, a MBIST engine identifier, or an algorithm identifier.

In some embodiments, configuring the MBIST engine 106 of the plurality of MBIST engines 106 may cause the programmable macro BIST controller 104 to count a total number of failures associated with one or more regions of the IC device 101, and determine that the total number of failures is less than a predetermined threshold value or that the total number of failures is greater than the predetermined threshold value. If the total number of failures is less than a predetermined threshold value, then the programmable macro BIST controller 104 performs a repair analysis on the one or more regions of the IC device 101. If the total number of failures is greater than a predetermined threshold value, then the programmable BIST controller 104 generates a flag indicating that the IC device is rejected.

In some embodiments, configuring an MBIST engine 106 of the plurality of MBIST engines 106 may cause the programmable macro BIST controller 104 to perform multiple iterations of a set of tests without the BIST controller 104 receiving an additional test vector from the ATE 102. That is, the same set of tests are repeated (e.g., looped).

In some embodiments, provided the programming interface does not alter from one IC device 101 to another, the programmable macro BIST controller 104 allows fully developed test programs (e.g., test vector) for the IC device 101 to be re-used on another IC device, which eliminates BIST test program revalidations. In some embodiments, individual BIST test programs can be split out into fully self-checkable subprograms defined by a Macro Test Instruction, which leads to better test time optimizations and yield learning resolutions. In some embodiments, the programmable macro BIST controller 104 allows an IC device developer to augment new test algorithms/schemes post silicon from existing Macro Test Instructions without needing to implement fully programmable MBIST engines, which results in die area savings. In some embodiments, the programmable macro BIST controller 104 may be configured to accumulate MBIST errors, which allows an IC device developer to develop criteria to reject fails despite repair limit.

In some embodiments, the programmable macro BIST controller 104 maps to a BIST (e.g., memory tests or system tests) or BIRA operation that spans more than 1 march, where each march applies a set of operation on each address exactly once. In some embodiments, a march with exactly one write operation on each SRAM address or a march with exactly one read operation on each SRAM address. In some embodiments, an instruction can also lead to BISR or INBR for selected set of BIST engines 106. In some embodiments, the programmable macro BIST controller 104 may change memory power states - e.g., from normal to retention states where parts of the SRAM power supply may be shutoff and vice versa. In some embodiments, the programmable macro BIST controller 104 may map to a redirect instruction where there is loop condition.

Thus, an MBIST 106 can execute a self-checking Macro test on a subset of SRAMs 108. A built-in-repair-analysis (BIRA) runs a BIST test and identifies how redundant repair configuration can be applied to memories for "repair" - the result is called repair solution. For Bist_mask, there is one bit per each MBIST engine from 106 - when set high, the corresponding MBIST engine from 106 is allowed to execute. The Bist_enable signal allows the MBIST engines 106 to operate. The built-in-self-repair (BISR) operation calls the MBIST engines 106 to temporarily apply the repair solution from BIRA tests to actually reconfigure or repair the memories. The Inbr transfer repair solution currently configured for the memories back to the analysis register for BIRA - this is to allow for repair accumulation. The Macro_sel is a global MBIST sequence selection setting -indicating to each MBIST engine 106 of the sequence of memory test operations selected for execution. The Fail_stop_intr (e.g., when fail_stop is enabled from Test Flow Control Register, when Programmable Macro BIST failing conditions are met, then this is sort of Fail Stop interrupt signal). The Err_limit is an integer that sets an error threshold on Bist errors, which occurs when BIRA test encounters a repairable memory miscompare. The PC_pointer (program counter pointer) points to the instruction index position on the Test Program Register.

In some embodiments, the programmable macro BIST controller 104 maps to a BIST (e.g., memory tests or system tests) or BIRA operation that spans more than 1 march, where each march applies a set of operation on each address exactly once. In some embodiments, a march with exactly one write operation on each SRAM address or a march with exactly one read operation on each SRAM address. In some embodiments, an instruction can also lead to BISR or INBR for selected set of BIST engines 106. In some embodiments, the programmable macro BIST controller 104 may change memory power states - e.g., from normal to retention states where parts of the SRAM power supply may be shutoff and vice versa. In some embodiments, the programmable macro BIST controller 104 may map to a redirect instruction where there is loop condition.

Figure 2:
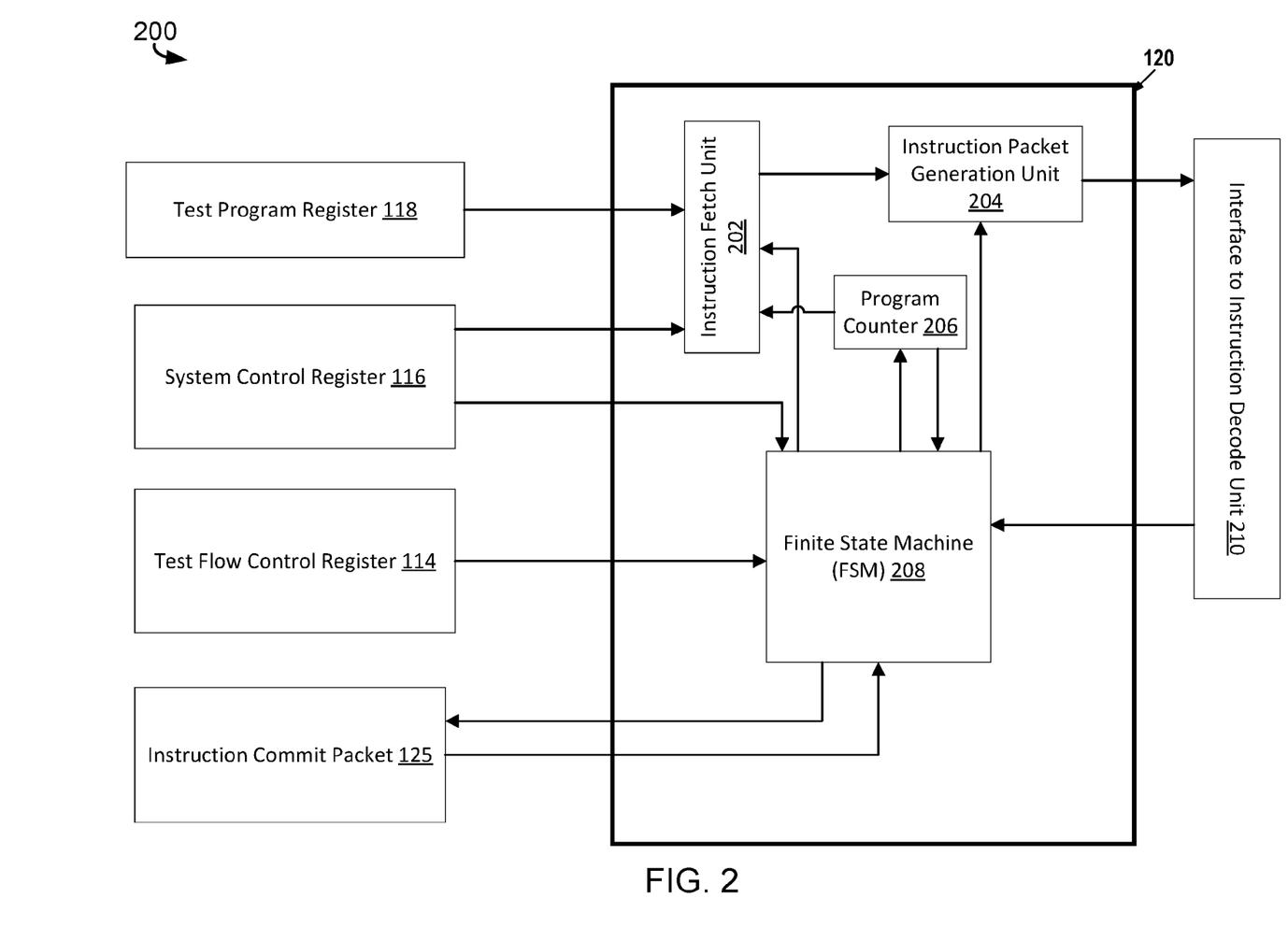
FIG. 2 is a block diagram illustrating an example environment for using the interface processing unit (IPU) in FIG. 1, according to some embodiments.

FIG. 2 is a block diagram illustrating an example environment for using the interface processing unit (IPU) in FIG. 1, according to some embodiments. The environment 200 includes the test flow control register 114, the system control register 116, and the test program register 118. The environment 200 includes the IPU 120 and an interface instruction decode unit 210. The environment 200 includes an instruction commit packet 125.

In some embodiments, the commit unit 126 may be configured to generate the instruction commit packet 125 and send the instruction commit packet 125 to the IPU 120. As shown in FIG. 2, the instruction commit packet 125 may include commit data (e.g., {commit, Fail_stop_intr, PC_redirect}).

In some embodiments, the IPU 120 includes an instruction fetch unit 202, an instruction packet generation unit, a program counter 206, and a finite state machine (FSM) 208.

In some embodiments, the IPU 120 may be configured to detect when Bist_en is set or Sys_en is set, and in response, start the FSM 208. In some embodiments, when the FSM 208 detects a commit, the FSM 208 may increment the program counter 206 and cause the next instruction fetch via the instruction fetch unit 202. In some embodiments, when the FSM 208 detects that a fail_stop is set, then the FSM 208 may stop the next instruction fetch and halt the IPU 120 when Fail_stop_intr (e.g., when a BIST failure is detected) is asserted.

In some embodiments, when the FSM 208 detects errors during BIRA testing then fail test. In some embodiments, the FSM 208 detects errors if Err_limit is >0, when cumulative error count during BIRA runs >= Err_limit.

In some embodiments, a Bist_mask is used to select which set (e.g., one or more) of MBIST engines 106 or SRAM 108 to be targeted for MBIST testing.

In some embodiments, the instruction fetch unit 202 may be configured to fetch the data using the program counter 206 as the index from the test program register 118 or the program register field of the system control register 116. In some embodiments, the program counter 206 may be updated to a different value if the commit unit 126 so flags (e.g., this may be used for looping).

Figure 3:
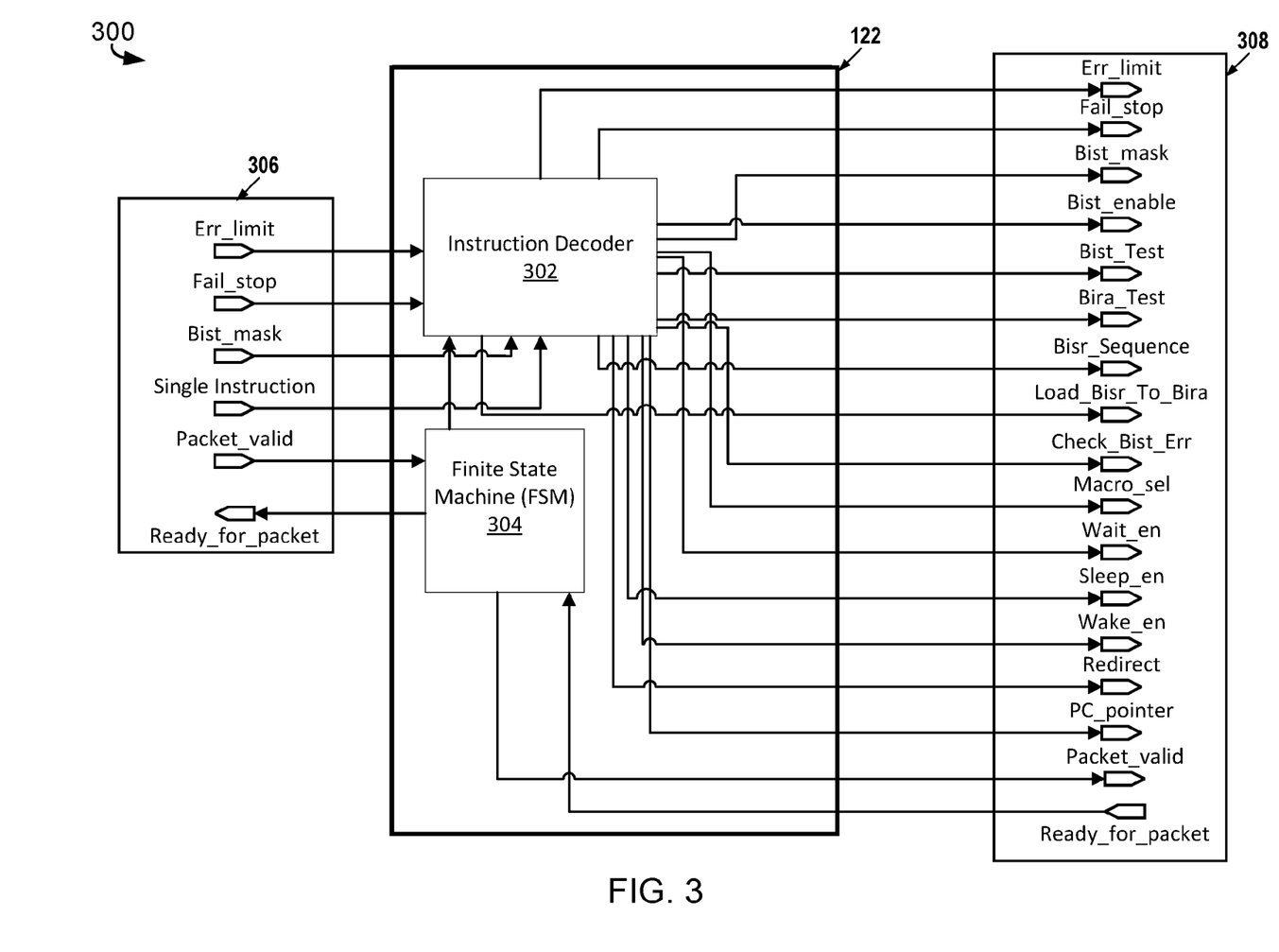
FIG. 3 is a block diagram illustrating an example environment for using the instruction decode unit (IDU) in FIG. 1, according to some embodiments.

FIG. 3 is a block diagram illustrating an example environment for using the instruction decode unit (IDU) in FIG. 1, according to some embodiments. The environment 300 includes the IDU 122. In some embodiments the IDU 122 may include an instruction decoder 302 and a finite state machine (FSM) 304.

The environment 300 includes a packet 306 that is generated and sent by the IPU 120 to the IDU 122. In some embodiments, the packet 306 may include Err_limit, Fail_stop, Bist_mask, Single Instruction, Packet_valid, and/or Ready_for_packet.

The environment 300 includes a packet 308 that is generated and sent by the IDU 122 to the BEXU 124. In some embodiments, the packet 308 may include Err_limit, Fail_stop, Bist_mask, Bist_enable, Bist_test, Bira_Test, Bisr_Seqence, Load_Bisr_To_Bira, Check_Bist_Err, Macro_sel, Wait_en, Sleep_en, Wake_en, Redirect, PC_pointer, Packet_valid, and/or Ready_for_packet.

In some embodiments, when Packet_valid asserts, if the FSM 304 is not waiting on the BEXU 124 (e.g., meaning BEXU 124 is ready for the next instruction), then the FSM 304 may assert Ready_for_packet, decode the current instruction being requested by the IPU 120, and forward the decoded instruction to the BEXU 124 for execution. In some embodiments, the FSM 304 is sequences when to decode and send the decoded instruction to the BEXU 124.

Figure 4:
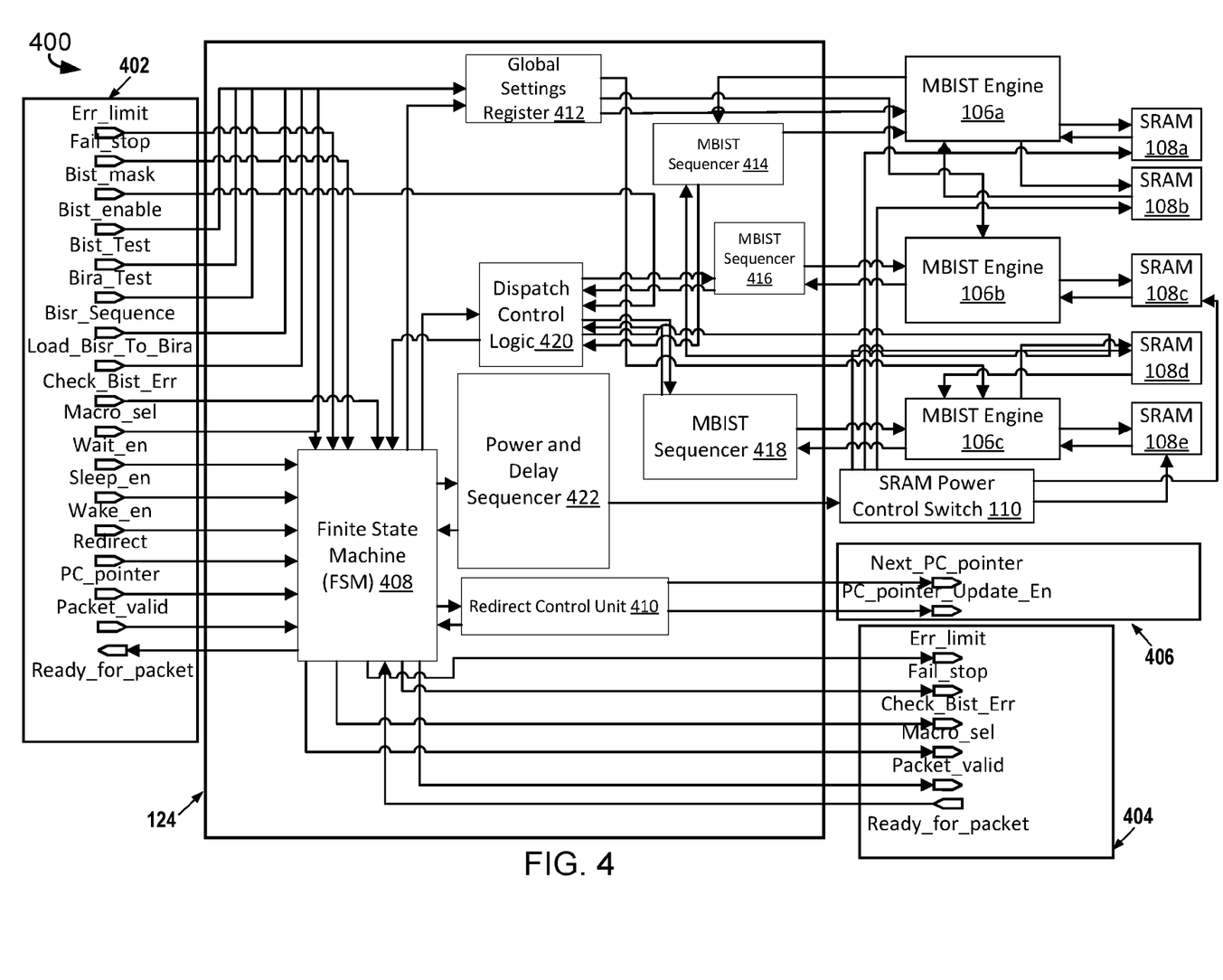
FIG. 4 is a block diagram illustrating an example environment for using the BIST execution unit (BEXU) in FIG. 1, according to some embodiments.

FIG. 4 is a block diagram illustrating an example environment for using the BIST execution unit (BEXU) in FIG. 1, according to some embodiments. The environment 400 includes the MBIST engines 106, the SRAMs 108, the SRAM power control switch 110, and the BEXU 124.

The environment 400 includes a packet 402 that is generated and sent by the IDU 122 to the BEXU 124. In some embodiments, the packet 402 may include Err_limit, Fail_stop, Bist_mask, Bist_enable, Bist_test, Bira_Test, Bisr_Seqence, Load_Bisr_To_Bira, Check_Bist_Err, Macro_sel, Wait_en, Sleep_en, Wake_en, Redirect, PC_pointer, Packet_valid, and/or Ready_for_packet.

The environment 400 includes a packet 404 that is generated and sent by the BEXU 124 to the RAU 128. In some embodiments, the packet 404 may include Err_limit, Fail_stop, Check_Bist_Err, Macro_sel, Packet_valid, and/or Ready_for_packet.

The environment 400 includes signals 406 that is generated and sent by the BEXU 124 to the commit unit 126. In some embodiments, the signals 406 may include Next_PC_pointer and/or PC_pointer_Update_En.

The BEXU 124 includes a finite state machine (FSM) 408, a redirect control unit 410, a global setting register unit 412, an MBIST sequencer 414, an MBIST sequencer 416, and MBIST sequencer 418, a dispatch control logic 420, a power and delay sequencer 422.

In some embodiments, the BEXU 124 generates and sends global settings data from the global setting register unit 412 to the MBIST engines 106. In some embodiments, the global setting register unit 412 stores global settings register data that may include global_mbist_en, global_bist, global_bira, global_bisr, global_inbr, global_macro_sel.

In some embodiments, the FSM 408 may be configured to wait for a valid packet to arrive. In some embodiments, the FSM 408 enters into a test setup state when a valid packet arrives, where the FSM 408 sets up the global settings register 412. In some embodiments, the BEXU 124 may be configured to propagate the global settings data from the global settings register 412 to a set (e.g., one or more) of the MBIST engines 106. In some embodiments, the FSM 408 may be configured to begin talking to the dispatch control logic 420 once the test setup completes to get all the selected MBIST sequencers (e.g., MBIST sequencer 414, MBIST sequencer 416, MBIST sequencer 418) to begin MBIST testing to the SRAMs 108.

In some embodiments, the FSM 408 may be configured to determine if the instruction is system instruction (e.g., not a memory test instruction), and response, the FSM 408 may begin talking to the power and delay sequencer 422 to insert delays and/or transition SRAMs 108 into fault exciting power states. In some embodiments, the FSM 408 may be configured to send redirect instructions to the redirect control unit 410. In some embodiments, the FSM 408 may be configured to send requests to the RAU 128 when an instruction finishes execution. In some embodiments, the FSM 408 de-asserts the global settings register 412 when the instruction completes execution.

In some embodiments, the dispatch control logic 420 may be configured to send control signals to each selected MBIST sequencer (e.g., MBIST sequencer 414, MBIST sequencer 416, MBIST sequencer 418) from the BIST_-mask. In some embodiments, the dispatch control logic 420 may be configured to wait for one or more of the MBIST sequencers to complete.

In some embodiments, the power and delay sequencer 422 may be configured to determine if the Memory Power Off is requested, and in response, turn off memory power switch and assert the necessary memory and logic isolation controls. In some embodiments, the power and delay sequencer 422 may be configured to determine if a delay is requested, and in response, wait using a counter to count to the number of cycles requested. In some embodiments, the power and delay sequencer 422 may be configured to determine if memory power up is requested, and in response, power the SRAMs backup and de-assert the isolation control signals.

In some embodiments, the redirect control unit 410 may be configured to monitor the loop iterations. In some embodiments, the redirect control unit 410 may be configured to redirect instruction completes when all iterations complete.

In some embodiments, each of the MBIST sequencers (e.g., MBIST sequencer 414, MBIST sequencer 416, MBIST sequencer 418) may be configured to start each MBIST Engine and wait for the MBIST Engine to complete.

Figure 5:
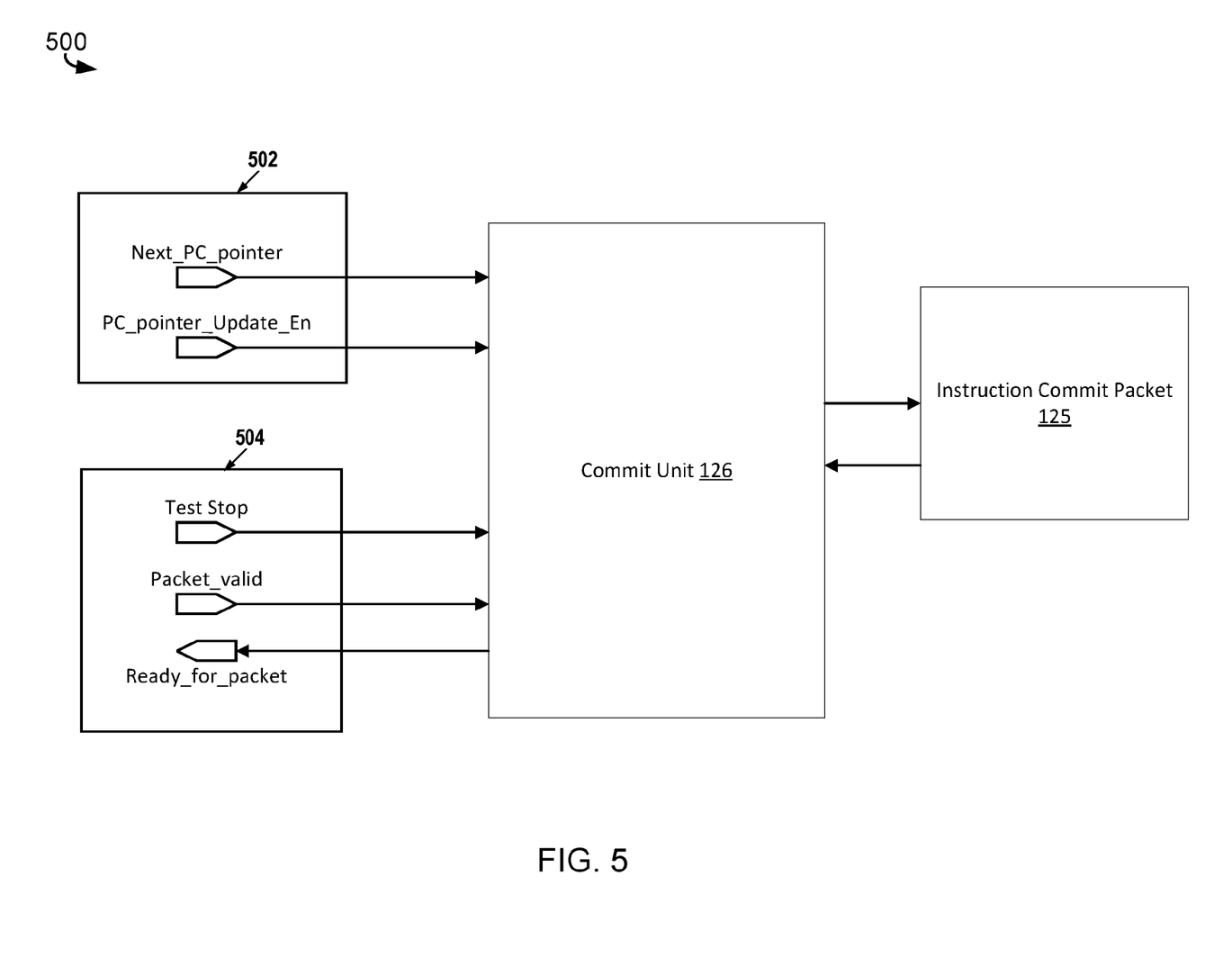
FIG. 5 is a block diagram illustrating an example environment for using the commit unit in FIG. 1, according to some embodiments.

FIG. 5 is a block diagram illustrating an example environment for using the commit unit in FIG. 1, according to some embodiments. The environment 500 includes signals 502 that may be generated and sent by the BEXU 124 to the commit unit 126. In some embodiments, the signals 502 may include Next_PC_pointer and/or PC_pointer_Update_En.

The environment 500 includes a packet 504 that is generated and sent by the BEXU 124 to the commit unit 126. In some embodiments, the packet 504 may include Test_Stop, Packet_valid, and/or Ready_for_packet.

The environment 500 includes the commit unit 126. In some embodiments, the commit unit 126 may be configured to determine a reset event, in response, clear or de-assert Fail_stop_intr, PC_redirect, and commit. In some embodiments, the commit unit 126 may be configured to wait for Packet_valid by asserting Ready_for_packet.In some embodiments, the commit unit 126 may be configured to determine if Test Stop is set when Packet_valid is set, and if set, then the commit unit 126 sets Fail_stop_intr immediately (e.g., without delay), sends the instruction commit packet 125 to the IPU 120, and sets commit (instruction commit signal as well)

In some embodiments, the commit unit 126 may be configured to determine if Packet_valid and PC_pointer_Update_En is set or unset. If both are set, then the commit unit 126 sets PC_redirect to Next _PC_pointer, sets commit, and sends the instruction commit packet 125 to the IPU 120. If both are not set, then the commit unit 126 determines that the instruction has completed and should be committed so set commit, and in response, the commit unit 126 clears Fail_stop_intr and PC_redirect, and forwards the instruction commit packet 125 to IPU 120.

Figure 6:
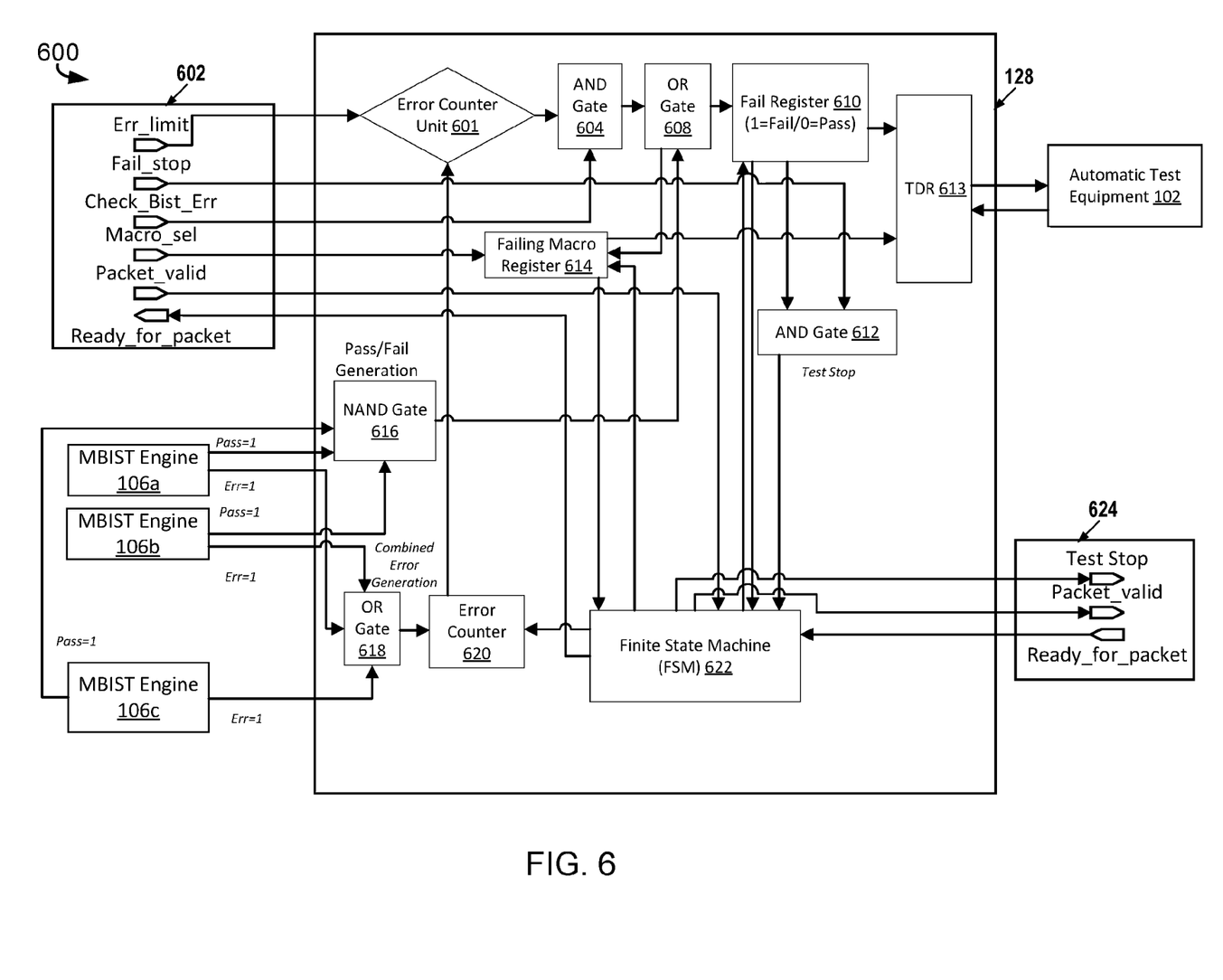
FIG. 6 is a block diagram illustrating an example environment for using the result analysis unit (RAU) in FIG. 1, according to some embodiments.

FIG. 6 is a block diagram illustrating an example environment for using the result analysis unit (RAU) in FIG. 1, according to some embodiments. The environment 600 includes a packet 602 that is sent to the RAU 128. In some embodiments, the packet 602 may include Err_limit, Fail_-stop, Check_Bist_Err, Macro_sel, Packet _valid, and/or Ready _for_packet. The environment 600 includes a packet 624 that is sent to the commit unit 126. In some embodiments, the packet 624 may include Test_Stop, Packet_valid, and/or Ready_for_packet.

The environment 600 includes the ATE 102, the RAU 128, and the MBIST engines 106. The RAU 128 includes an error counter unit 601, an AND gate 604, an OR gate 608, a fail register 610, an AND gate 612, a test data register (TDR) 613, a failing macro register 614, a NAND gate 616, an OR gate 618, an error counter 620, and finite state machine (FSM) 622.

In some embodiments, the FSM 622 may be configured to determines a triggering event (e.g., a reset event, a test program execution begins), and if the triggering event occurs, then the FSM resets the Error Counter, Failing Macro Register, and Fail Register.

In some embodiments, the FSM 622 may be configured to wait, out of reset, for packet from BEXU 124. In some embodiments, the FSM 622 may be configured to determine when Packet_valid from BEXU 124 is high, and in response, enables the error counter unit 601 to begin counting and if the error counted exceeds a threshold then set output/results, thereby allowing the Failing Macro Register and Fail Register to sample results from MBIST engines 106.

In some embodiments, the FSM 622 may be configured to determine when sampling from the MBIST engines 106 are complete (e.g., Fail Register and Failing Macro Register would complete sampling results). In the case where Test Stop is high, the Failing Macro Register stores the failing macro information. However, if Test Stop is not set, which happens when Fail_stop is not set, then the most recent failing Macro selected is registered.

In some embodiments, the test data register (TDR) 613 may be configured to store pass fail status and the Failing Macro information. In some embodiments, the RAU 128 may include an interface (e.g., JTAG) that can be accessed by the ATE 102 retrieve the pass fail status and the Failing Macro information from the TDR 613.

Figure 7:
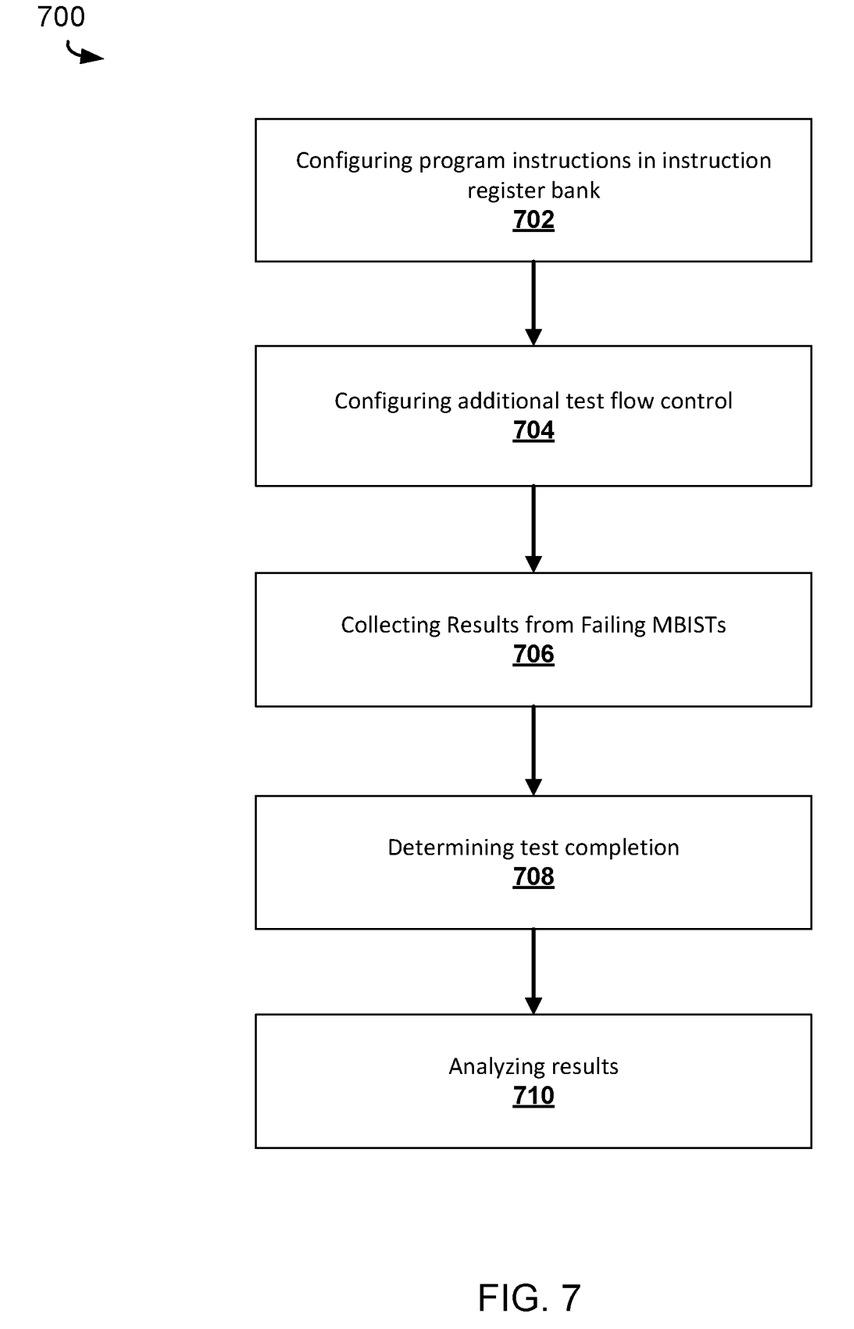
FIG. 7 is a flow diagram of a method for using a programmable macro built-in self-test (BIST) to test an integrated circuit, according to some embodiments.

FIG. 7 is a flow diagram of a method for using a programmable macro built-in self-test (BIST) to test an integrated circuit, according to some embodiments. Although the operations are depicted in FIG. 7 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the method 700 may be performed by processing logic that comprises hardware (e.g., circuitry, dedicated logic, programmable logic, microcode, etc.), firmware, or a combination thereof. In some embodiments, some or all operations of method 700 may be performed by one or more components (e.g., BIST controller 104, MBIST engine 106, etc.) of the IC device 101 in FIG. 1.

The method 700, in some embodiments, includes the operation 702 of configuring program instructions in instruction register bank.

The method 700, in some embodiments, includes the operation 704 of configuring additional test flow control. In some embodiments, the operation 704 includes configuring the retention delay and/or which MBIST engines 106 should be executed. In some embodiments, the operation 704 includes issuing initialization and/or a Power-On-Self-Test (POST) request. The method 700, in some embodiments, includes the operation 706 of collecting results from failing MBIST engines 106. The method 700, in some embodiments, includes the operation 706 of determining a test completion. The method 700, in some embodiments, includes the operation 706 of analyzing results.

Figure 8:
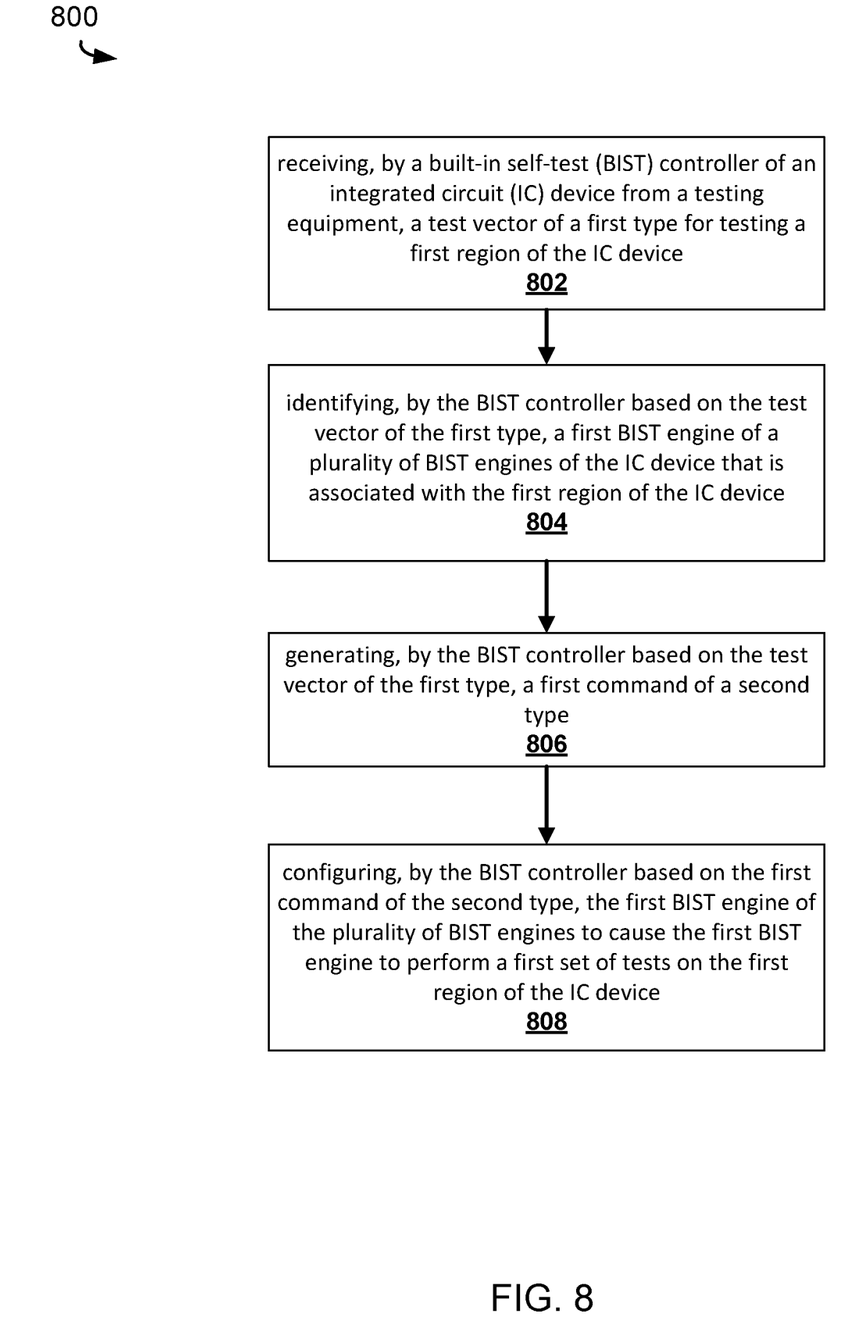
FIG. 8 is a flow diagram of a method for using a programmable macro built-in self-test (BIST) to test an integrated circuit, according to some embodiments.

FIG. 8 is a flow diagram of a method for using a programmable macro built-in self-test (BIST) to test an integrated circuit, according to some embodiments. Although the operations are depicted in FIG. 8 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the method 800 may be performed by processing logic that comprises hardware (e.g., circuitry, dedicated logic, programmable logic, microcode, etc.), firmware, or a combination thereof. In some embodiments, some or all operations of method 800 may be performed by one or more components (e.g., BIST controller 104, MBIST engine 106, etc.) of the IC device 101 in FIG. 1.

The method 800, in some embodiments, includes the operation 802 of receiving, by a built-in self-test (BIST) controller (e.g., programmable BIST controller 104) of an integrated circuit (IC) device from a testing equipment, a test vector of a first type for testing a first region of the IC device.

The method 800, in some embodiments, includes the operation 804 of identifying, by the BIST controller based on the test vector of the first type, a first BIST engine of a plurality of BIST engines of the IC device that is associated with the first region of the IC device.

The method 800, in some embodiments, includes the operation 806 of generating, by the BIST controller based on the test vector of the first type, a first command of the second type.

The method 800, in some embodiments, includes the operation 810 of configuring, by the BIST controller based on the first command of the second type, the first BIST engine of the plurality of BIST engines to cause the first BIST engine to perform a first set of tests on the first region of the IC device.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "performing," "generating," "determining," "placing," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may comprise firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
   receiving, by a built-in self-test (BIST) controller of an integrated circuit (IC) device from a testing equipment, a test vector of a first type of programming language for testing a first region of the IC device;
   identifying, by the BIST controller based on the test vector of the first type of programming language, a first BIST engine of a plurality of BIST engines of the IC device that is associated with the first region of the IC device;
   generating, by the BIST controller based on the test vector of the first type of programming language, a first command of a second type of programming language; and
   configuring, by the BIST controller based on the first command of the second type of programming language, the first BIST engine of the plurality of BIST engines to cause the first BIST engine to perform a first set of tests on the first region of the IC device.

2. The method of claim 1, wherein the test vector of the first type of programming language is further for testing a second region of the IC device, and further comprising:
   identifying, by the BIST controller based on the test vector of the first type of programming language, a second BIST engine of a plurality of BIST engines of the IC device that is associated with the second region of the IC device;
   generating, by the BIST controller based on the test vector of the first type of programming language, a second command of the second type of programming language; and
   configuring, by the BIST controller based on the second command of the second type of programming language, the second BIST engine of the plurality of BIST engines to cause the second BIST engine to perform a second set of tests on the first region of the IC device.

3. The method of claim 1, wherein the first BIST engine performs the first set of tests on the first region of the IC device using a first algorithm, and the second BIST engine performs the second set of tests on the second region of the IC device using a second algorithm.

4. The method of claim 1, wherein the first BIST engine performs at least one of a memory test on a memory bank of the IC device, a power mode switching test on a sub-system of the IC device, or a delay insertion test on the sub-system of the IC device.

5. The method of claim 1, wherein the first type corresponds to a high-level programming language and the second type of programming language corresponds to a low-level programming language.

6. The method of claim 1, wherein the IC device is of a first kind of device and further comprising:
   re-using the test vector to test one or more regions of a second IC device of a second kind of device.

7. The method of claim 1, wherein configuring the first BIST engine of the plurality of BIST engines further causes the first BIST engine to:
   provide failure diagnostic information to the testing equipment indicative of at least one of a memory bank identifier, a memory address identifier, or a bit position identifier, an MBIST engine, or an algorithm identifier.

8. The method of claim 1, wherein configuring the first BIST engine of the plurality of BIST engines further causes the first BIST engine to:
   counting a total number of failures associated with the first region of the IC device; and
   determining that the total number of failures is less than a predetermined threshold value or that the total number of failures is greater than the predetermined threshold value, and either:
      performing a repair analysis on the first region of the IC device responsive to determining that the total number of failures is less than a predetermined threshold value; or
      generating a flag indicating that the IC device is rejected responsive to determining that the total number of failures is greater than the predetermined threshold value.

9. The method of claim 1, wherein configuring the first BIST engine of the plurality of BIST engines further causes the first BIST engine to:
   perform multiple iterations of the first set of tests without the BIST controller receiving an additional test vector from the testing equipment.

10. The method of claim 1, wherein the test vector comprises at least one of memory repair analysis instructions, soft repair Distribution instructions, built-in redundancy analysis (BIRA) register population instructions, cumulative repair instructions, memory BIST testing instructions, logic BIST testing instructions.

11. An integrated circuit (IC) device, comprising:
    a plurality of built-in self-test (BIST) engines; and
    a BIST controller coupled to the plurality of BIST engines, wherein the BIST controller is configured to:
       receive, from a testing equipment, a test vector of a first type of programming language for testing a first region of the IC device;
       identify, based on the test vector of the first type of programming language, a first BIST engine of the plurality of BIST engines that is associated with the first region of the IC device;
       generate, based on the test vector of the first type of programming language, a first command of a second type of programming language; and
       configure, based on the first command of the second type of programming language, the first BIST engine of the plurality of BIST engines to cause the first BIST engine to perform a first set of tests on the first region of the IC device.

12. The IC device of claim 11, wherein the test vector of the first type of programming language is further for testing a second region of the IC device, and wherein the BIST unit further configured to:
    identify, based on the test vector of the first type of programming language, a second BIST engine of a plurality of BIST engines that is associated with the second region of the IC device;
    generate, based on the test vector of the first type of programming language, a second command of the second type of programming language; and
    configure, based on the second command of the second type of programming language, the second BIST engine of the plurality of BIST engines to cause the second BIST engine to perform a second set of tests on the first region of the IC device.

13. The IC device of claim 11, wherein the first BIST engine is configured to perform the first set of tests on the first region of the IC device using a first algorithm, and the second BIST engine is configured to perform the second set of tests on the second region of the IC device using a second algorithm.

14. The IC device of claim 11, wherein the first BIST engine is configured to perform at least one of a memory test on a memory bank of the IC device, a power mode switching test on a sub-system of the IC device, or a delay insertion test on the sub-system of the IC device.

15. The IC device of claim 11, wherein the first type of programming language corresponds to a high-level programming language and the second type of programming language corresponds to a low-level programming language.

16. The IC device of claim 11, wherein configuring the first BIST engine of the plurality of BIST engines further causes the first BIST engine to:
    provide failure diagnostic information to the testing equipment indicative of at least one of a memory bank identifier, a memory address identifier, or a bit position identifier, an MBIST engine, or an algorithm identifier.

17. The IC device of claim 11, wherein configuring the first BIST engine of the plurality of BIST engines further causes the first BIST engine to:
    count a total number of failures associated with the first region of the IC device; and
    determine that the total number of failures is less than a predetermined threshold value or that the total number of failures is greater than the predetermined threshold value, and either:
    perform a repair analysis on the first region of the IC device responsive to determining that the total number of failures is less than a predetermined threshold value; or
    generate a flag indicating that the IC device is rejected responsive to determining that the total number of failures is greater than the predetermined threshold value.

18. The IC device of claim 11, wherein configuring the first BIST engine of the plurality of BIST engines further causes the first BIST engine to:
    perform multiple iterations of the first set of tests without the BIST controller receiving an additional test vector from the testing equipment.

19. The IC device of claim 1, wherein the test vector comprises at least one of memory repair analysis instructions, soft repair Distribution instructions, built-in redundancy analysis (BIRA) register population instructions, cumulative repair instructions, memory BIST testing instructions, logic BIST testing instructions.

20. An integrated circuit (IC) device, comprising:
    a plurality of memory banks;
    a plurality of built-in self-test (BIST) engines, each coupled to a respective memory bank of the plurality of memory banks; and
    a BIST controller coupled to the plurality of BIST engines, wherein the BIST controller is configured to:
        receive, from a testing equipment, a test vector of a first type of programming language for testing a subset of memory banks of the plurality of memory banks;
        identify, based on the test vector of the first type of programming language, a subset of BIST engines of the plurality of BIST engines that are associated with the subset of memory banks of the plurality of memory banks;
        generate, based on the test vector of the first type of programming language, a command of a second type of programming language; and
        configure, based on the command of the second type of programming language, the subset of BIST engines of the plurality of BIST engines to cause the subset of BIST engines to perform a set of tests on the subset of memory banks of the plurality of memory banks.

* * * * *